United States Patent
Chang et al.

(10) Patent No.: US 9,425,061 B2
(45) Date of Patent: Aug. 23, 2016

(54) BUFFER CAP LAYER TO IMPROVE MIM STRUCTURE PERFORMANCE

(71) Applicant: Taiwan Semiconductor Manufacturing Co., Ltd., Hsin-Chu (TW)

(72) Inventors: Yao-Wen Chang, Taipei (TW); Jian-Shiou Huang, Fangliao Township (TW); Hsing-Lien Lin, Hsin-Chu (TW); Cheng-Yuan Tsai, Chu-Pei (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/289,739

(22) Filed: May 29, 2014

(65) Prior Publication Data

US 2015/0349254 A1    Dec. 3, 2015

(51) Int. Cl.
| | |
|---|---|
| *H01L 45/00* | (2006.01) |
| *H01L 21/3105* | (2006.01) |
| *H01L 49/02* | (2006.01) |
| *H01L 21/02* | (2006.01) |

(52) U.S. Cl.
CPC ...... *H01L 21/31051* (2013.01); *H01L 21/0214* (2013.01); *H01L 21/0217* (2013.01); *H01L 21/02271* (2013.01); *H01L 21/02274* (2013.01); *H01L 28/60* (2013.01); *H01L 45/08* (2013.01); *H01L 45/1233* (2013.01); *H01L 45/1253* (2013.01); *H01L 45/146* (2013.01); *H01L 45/16* (2013.01)

(58) Field of Classification Search
CPC ... H01L 27/10852; H01L 28/40; H01L 28/55; H01L 28/60; H01L 28/65; H01L 28/90; H01L 45/085; H01L 45/1233; H01L 45/143; H01L 45/1683

USPC .......... 257/E29.343, 532, E21.008, E21.011, 257/E21.014, E45.002, 306, E27.016, 257/E31.117, 303; 438/381, 399, 622, 66
See application file for complete search history.

(56) References Cited

U.S. PATENT DOCUMENTS

| | | |
|---|---|---|
| 5,541,428 A | 7/1996 | Nagatomo |
| 5,903,023 A | 5/1999 | Hoshi |
| 5,977,582 A | 11/1999 | Fleming et al. |

(Continued)

OTHER PUBLICATIONS

U.S. Appl. No. 14/249,482, filed Apr. 10, 2014.

(Continued)

*Primary Examiner* — William F Kraig
*Assistant Examiner* — Edward Chin
(74) *Attorney, Agent, or Firm* — Eschweiler & Associates, LLC

(57) ABSTRACT

The present disclosure relates to method of forming a MIM (metal-insulator-metal) structure having a buffer cap layer that reduces stress induced by an overlying stress-inducing protective layer, and an associated apparatus. The method is performed by forming a lower conductive layer over a semiconductor substrate, forming a dielectric layer over the lower conductive layer, and forming an upper conductive layer over the dielectric layer. A buffer cap layer is formed over the upper conductive layer and a stress-inducing protective layer is formed onto the buffer cap layer. The buffer cap layer reduces a stress induced onto the upper conductive layer by the stress-inducing protective layer, thereby reducing leakage current between the lower and upper conductive layers.

20 Claims, 6 Drawing Sheets

(56) References Cited

U.S. PATENT DOCUMENTS

| | | | |
|---|---|---|---|
| 6,046,467 A | 4/2000 | Arita et al. | |
| 6,115,233 A | 9/2000 | Seliskar et al. | |
| 6,227,211 B1 | 5/2001 | Yang et al. | |
| 6,281,134 B1 | 8/2001 | Yeh et al. | |
| 6,720,232 B1 | 4/2004 | Tu et al. | |
| 6,919,244 B1 | 7/2005 | Remmel et al. | |
| 7,956,400 B2 | 6/2011 | Smith | |
| 8,298,875 B1* | 10/2012 | Or-Bach | H01L 29/4236 257/E21.411 |
| 8,546,914 B2 | 10/2013 | Su et al. | |
| 8,753,953 B1 | 6/2014 | Cheng et al. | |
| 2001/0046737 A1 | 11/2001 | Ahn et al. | |
| 2002/0094656 A1 | 7/2002 | Armacost et al. | |
| 2003/0049885 A1 | 3/2003 | Iijima et al. | |
| 2003/0178665 A1 | 9/2003 | Takenaka | |
| 2003/0178666 A1 | 9/2003 | Lee et al. | |
| 2003/0232481 A1* | 12/2003 | Huang | H01L 28/55 438/396 |
| 2004/0061177 A1 | 4/2004 | Merchant et al. | |
| 2004/0140527 A1 | 7/2004 | Furuya et al. | |
| 2004/0180530 A1* | 9/2004 | Li | H01L 45/085 438/622 |
| 2004/0256654 A1 | 12/2004 | Korner et al. | |
| 2005/0062130 A1 | 3/2005 | Ciancio et al. | |
| 2005/0170583 A1 | 8/2005 | Park | |
| 2005/0205913 A1 | 9/2005 | Yaegashi | |
| 2006/0145293 A1 | 7/2006 | Cho | |
| 2007/0045702 A1* | 3/2007 | Liang | H01L 28/40 257/306 |
| 2007/0200162 A1 | 8/2007 | Tu et al. | |
| 2008/0055816 A1 | 3/2008 | Park et al. | |
| 2008/0061345 A1 | 3/2008 | Wang | |
| 2008/0217775 A1 | 9/2008 | Pai et al. | |
| 2008/0277762 A1* | 11/2008 | Takewaki | H01L 28/40 257/532 |
| 2008/0290459 A1 | 11/2008 | Barth et al. | |
| 2009/0008743 A1* | 1/2009 | Lee | H01L 28/90 257/532 |
| 2009/0014835 A1 | 1/2009 | Furumiya et al. | |
| 2009/0134493 A1* | 5/2009 | Iwaki | H01L 28/55 257/532 |
| 2009/0200638 A1* | 8/2009 | Smith | H01L 21/76816 257/532 |
| 2010/0065944 A1 | 3/2010 | Tu et al. | |
| 2010/0079929 A1 | 4/2010 | Smeys et al. | |
| 2010/0127350 A1 | 5/2010 | Totsuka | |
| 2010/0164669 A1 | 7/2010 | Soendker et al. | |
| 2010/0213572 A1 | 8/2010 | Ching et al. | |
| 2010/0270643 A1 | 10/2010 | Iwaki | |
| 2010/0289108 A1 | 11/2010 | Meinel et al. | |
| 2010/0301451 A1 | 12/2010 | Iwaki | |
| 2011/0303284 A1* | 12/2011 | Kim | B32B 17/10036 136/259 |
| 2012/0091559 A1 | 4/2012 | Tu et al. | |
| 2012/0181657 A1 | 7/2012 | Wu et al. | |
| 2012/0199946 A1 | 8/2012 | Kageyama | |
| 2012/0319239 A1 | 12/2012 | Chang et al. | |
| 2013/0020678 A1 | 1/2013 | Tu et al. | |
| 2013/0193556 A1 | 8/2013 | Lee et al. | |
| 2013/0270675 A1 | 10/2013 | Childs et al. | |
| 2013/0277680 A1* | 10/2013 | Green | H01L 29/402 257/76 |
| 2013/0285203 A1 | 10/2013 | Hiroi et al. | |
| 2013/0292794 A1 | 11/2013 | Pai et al. | |
| 2013/0300003 A1 | 11/2013 | Sun et al. | |
| 2013/0320493 A1 | 12/2013 | Chang et al. | |
| 2014/0159200 A1 | 6/2014 | Loke et al. | |
| 2014/0291805 A1 | 10/2014 | Hong | |
| 2015/0028408 A1 | 1/2015 | Meiser et al. | |
| 2015/0048483 A1* | 2/2015 | Kuo | H01L 28/60 257/532 |
| 2015/0061073 A1* | 3/2015 | Kim | H01L 27/016 257/532 |
| 2015/0108605 A1 | 4/2015 | Park et al. | |
| 2015/0115408 A1 | 4/2015 | Sun et al. | |

OTHER PUBLICATIONS

U.S. Appl. No. 14/249,513, filed Apr. 10, 2014.
U.S. Appl. No. 14/249,498, filed Apr. 10, 2014.
Non Final Office Action Dated May 22, 2015 U.S. Appl. No. 14/249,513.
Final Office Action Dated Dec. 14, 2015 U.S. Appl. No. 11/249,498.
Notice of Allowance dated Aug. 14, 2015 for U.S. Appl. No. 14/249,482.
Non-Final Office Action dated Aug. 14, 2015 for U.S. Appl. No. 14/249,498.
Final Office Action Dated Aug. 28, 2015 U.S. Appl. No. 14/249,513.
Notice of Allowance dated Feb. 12, 2016 for U.S. Appl. No. 14/249,498.
Notice of Allowance dated Mar. 14, 2016 U.S. Appl. No. 14/249,513.

* cited by examiner

BUFFER CAP LAYER TO IMPROVE MIM STRUCTURE PERFORMANCE

BACKGROUND

Metal-insulator metal (MIM) structures comprise an insulating layer disposed between conductive layers (e.g., metal layers). The conductive metal layers have free charge carriers (e.g., holes and/or electrons) that allow for electrical charge to easily travel, while the insulating layer does not have free charge carriers. MIM structures are found in a wide range of applications in modern day integrated chips. For example, MIM structures may be used in passive devices such as MIM capacitors or in memory devices such as resistive random access memory (RRAM) cells. More recent developments have also proposed the use of MIM structures in other applications, such as in diodes and waveguides, for example.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
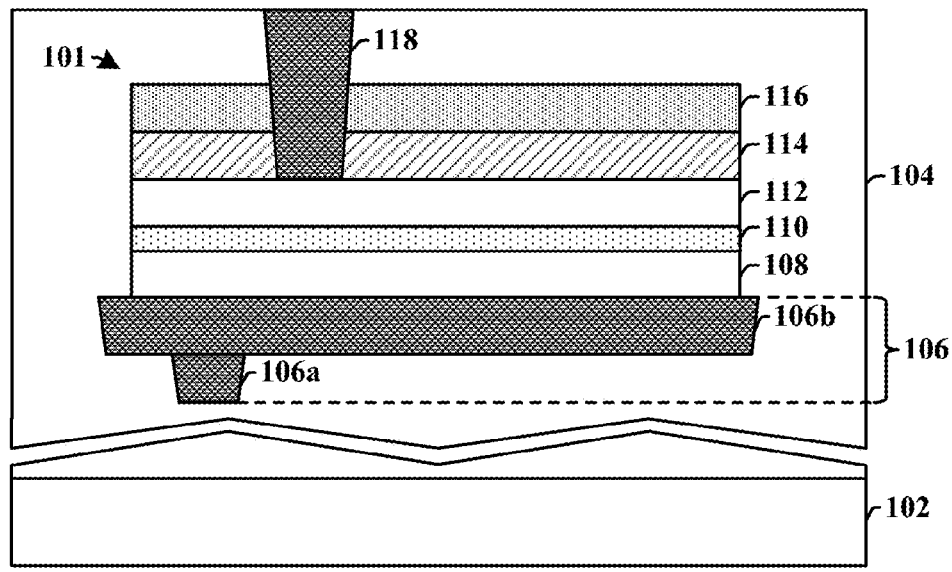
FIG. 1 illustrates a cross-sectional view of some embodiments of an integrated chip having a MIM (metal-insulator-metal) structure comprising a buffer cap layer configured to reduce leakage between conductive layers.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One type of commonly used MIM (metal-insulator-metal) structure is a MIM capacitor. A MIM capacitor has a capacitor top metal (CTM) and a capacitor bottom metal (CBM) separated by a layer of dielectric material. A MIM capacitor may often be integrated into a back-end-of-the-line (BEOL) metallization stack of an integrated chip, at a position that is vertically disposed between an underlying first metal layer and an overlying second metal layer.

MIM capacitors are typically covered with a silicon nitride film formed by a PE-CVD deposition (PE-SiN layer) process. The PE-SiN film is configured to act as an etch stop layer that protects the MIM capacitor during subsequent processing. As the size of MIM capacitors decreases, the relative thickness of the PE-SiN film has increased. However, it has been appreciated that as the thickness of the PE-SiN film increases, a compressive stress generated by the PE-SiN film also increase. The compressive stress acts upon corners of the CTM, causing the corners to bend downward and thereby increasing leakage current between the CTM and CBM.

Accordingly, the present disclosure relates to a method of forming a MIM (metal-insulator-metal) structure having a buffer cap layer that is configured to reduce stress induced by an overlying stress-inducing protective layer, and an associated apparatus. In some embodiments, the method is performed by forming a lower conductive layer over a semiconductor substrate, forming a dielectric layer over the lower conductive layer, and forming an upper conductive layer over the dielectric layer. A buffer cap layer is formed over the upper conductive layer and a stress-inducing protective layer is formed onto the buffer cap layer. The buffer cap layer is configured to reduce a stress induced onto the upper conductive layer by the stress-inducing protective layer, thereby reducing leakage current between the lower and upper conductive layers.

FIG. 1 illustrates a cross-sectional view of some embodiments of an integrated chip 100 having a MIM (metal-insulator-metal) structure 101.

The MIM structure 101 is disposed within a dielectric material 104 located over a semiconductor substrate 102. In various embodiments, the MIM structure may comprise a MIM capacitor, a resistive random access memory (RRAM) cell, a MIM diode, or a MIM waveguide, for example. The MIM structure 101 comprises a lower conductive layer 108 (e.g., a bottom metal layer). In some embodiments, the lower conductive layer 108 may be positioned over one or more lower metal interconnect layers 106 (e.g., a metal via 106a and/or a metal wire 106b). A dielectric layer 110 is located over the lower conductive layer 108. In some embodiments, the dielectric layer 110 may comprise a high-k dielectric layer (i.e., a dielectric layer having a dielectric constant that is greater than that of silicon dioxide). In other embodiments, the dielectric layer 110 may comprise a dielectric data storage layer having a variable resistance. An upper conductive layer 112 (e.g., an upper metal layer) is positioned over the dielectric layer 110, and an overlying metal interconnect layer 118 (e.g., a via) is disposed onto the upper conductive layer 112.

A buffer cap layer 114 is disposed over the upper conductive layer 112, and a stress-inducing protective layer 116 is disposed over the buffer cap layer 114 in a manner such that the buffer cap layer 114 separates the upper conductive layer 112 from the stress-inducing protective layer 116. The buffer cap layer 114 is configured to reduce a stress (e.g., a compressive stress) induced onto the upper conductive layer 112 by the stress-inducing protective layer 116. Reducing a stress induced onto the upper conductive layer 112 by the stress-inducing protective layer 116 reduces a leakage current between the upper conductive layer 112 and the lower conductive layer 108, thereby improving performance of the disclosed MIM structure 101. In some embodiments, the buffer cap layer 114 may comprise an oxide layer (e.g., an un-doped silicate glass (USG)) and the stress-inducing protective layer 116 may comprise a silicon nitride film (a PE-SiN layer) or a silicon oxy-nitride film (PE-SiON layer) formed by a PE-CVD (plasma enhanced chemical vapor deposition) process.

Figure 2:
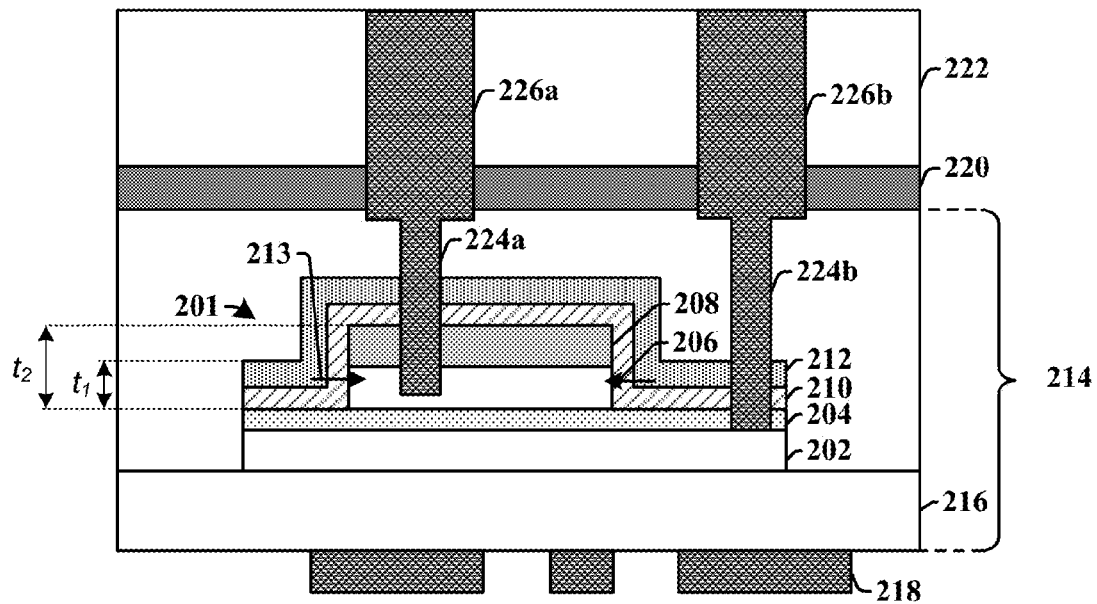
FIG. 2 illustrates a cross-sectional view of some embodiments of an integrated chip comprising a MIM capacitor having a buffer cap layer.
Figure 3:
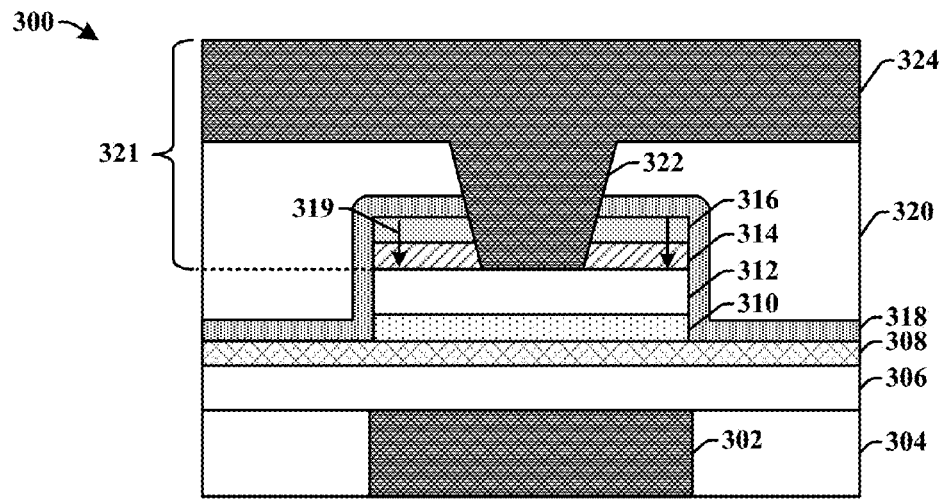
FIG. 3 illustrates a cross-sectional view of some embodiments of an integrated chip comprising a resistive random access memory (RRAM) cell having a buffer cap layer.

As provided herein, the disclosed MIM structure (e.g., MIM structure 101) may comprise any type of device that has a stress-inducing protective layer (e.g., a PE-SiN layer, a PE-SiON layer) disposed over a stacked metal-insulator-metal (MIM) structure. For example, FIGS. 2-3 illustrate some embodiments of MIM structures having a disclosed buffer cap layer configured to reduce stress induced onto an upper conductive layer by a stress-inducing protective layer. It will be appreciated that the disclosed MIM structure is not limited to the MIM structures of FIGS. 2-3, but rather that FIGS. 2-3 are merely exemplary MIM structures.

FIG. 2 illustrates a cross-sectional view of some embodiments of an integrated chip 200 having a MIM (metal-insulator-metal) capacitor 201 comprising a stress reducing buffer cap layer.

The MIM capacitor 201 includes a capacitor bottom metal (CBM) 202 (i.e., a bottom electrode) and a capacitor top metal (CTM) 206 (i.e., a top electrode). The CBM 202 and CTM 206 are electrically isolated from one another by a capacitor dielectric layer 204 disposed therebetween. The capacitor dielectric layer 204 is configured to separate the CBM 202 from the CTM 206, so that the MIM capacitor 201 is able to store energy in an electric field generated between the CBM 202 and the CTM 206.

In various embodiments, the CBM 202 and/or the CTM 206 may comprise various conductive materials, such as aluminum (Al), titanium (Ti), titanium nitride (TiN), tantalum (Ta), tantalum nitride (TaN), tungsten (W), copper (Cu), etc. In some embodiments, the capacitor dielectric layer 204 may comprise a high-k dielectric material having a dielectric constant greater than 3.9 (i.e., a dielectric material having a dielectric constant greater than silicon dioxide). In some embodiments, the capacitor dielectric layer 204 may comprise one or more of silicon dioxide ($SiO_2$), silicon nitride ($Si_3N_4$), aluminum oxide ($Al_2O_3$), tantalum oxide ($Ta_2O_5$), titanium oxide ($TiO_2$), zirconium oxide ($ZrO_2$), hafnium oxide ($HfO_2$), hafnium silicate ($HfSiO_4$), etc. For example, the capacitor dielectric layer 204 may comprise a ZAZ dielectric film comprising stacked layers of $ZrO_2/Al_2O_3/ZrO_2$.

A buffer cap layer 210 is disposed onto a masking layer 208 (e.g., a hard mask layer) located over the CTM 206, and an etch stop layer 212 is disposed onto the buffer cap layer 210. The buffer cap layer 210 and the etch stop layer 212 comprise stepped layers having varying heights. The buffer cap layer 210 is disposed onto the masking layer 208 and the capacitor dielectric layer 204, and abuts sidewalls of the CTM 206 and the masking layer 208. The etch stop layer 212 is configured to induce a compressive stress 213 that pushes laterally on the CTM 206. The buffer cap layer 210 is configured to mitigate the compressive stress 213 pushing on the CTM 206, so as to reduce leakage between the CTM 206 and the capacitor bottom metal layer 202. In some embodiments, the buffer cap layer 210 and the etch stop layer 212 may have a first thickness $t_1$ that is less than a second thickness $t_2$ of the CTM 206 and the masking layer 208.

In some embodiments, the capacitor ILD layer 214 may extend below the CBM 202 as a dielectric buffer layer 216. In various embodiments, the dielectric buffer layer 216 may have a thickness that is in a range of between approximately 5% and approximately 50% of the thickness of the capacitor ILD layer 214. In such embodiments, the dielectric buffer layer 216 will protect the MIM capacitor 201 from hillocks (i.e., spike or hill-like structures) protruding from an under-metal layer 218 comprising one or more metal structures.

In some embodiments, a planar etch stop layer 220 is disposed over the capacitor ILD layer 214. The planar etch stop layer 220 has a planar surface disposed between a metal wire layer 226 and a plurality of metal vias 224. The metal wire layer 226 comprises a conductive material (e.g., copper, aluminum, etc.) disposed within a metal ILD layer 222 and configured to provide for lateral interconnections. The plurality of metal vias 224 are configured to provide for vertical interconnections between the MIM capacitor 201 and the metal wire layer 226.

FIG. 3 illustrates a cross-sectional view of some embodiments of RRAM (resistive random access memory) cell 300 having a stress reducing buffer cap layer.

RRAM cell 300 comprises a dielectric data storage layer 308 disposed between a bottom electrode 306 and a top electrode 312. The bottom electrode 306 is located over a lower metal interconnect layer 302 surrounded by lower inter-level dielectric (ILD) layer 304. In some embodiments, the lower metal interconnect layer 302 may comprise one of a plurality of metal interconnect layers located between the bottom electrode 306 and an underlying semiconductor substrate (not shown).

The dielectric data storage layer 308 has a variable resistance, which depending on an applied voltage, will undergo a reversible change between a high resistance state associated with a first data state (e.g., a '0') and a low resistance state associated with a second data state (e.g., a '1'). For example, a voltage applied to the dielectric data storage layer 308 will induce conductive paths (e.g., oxygen vacancies) to form across the dielectric data storage layer 308, thereby reducing the resistance of the dielectric data storage layer 308. In some embodiments, a capping layer 310 may be disposed over the dielectric data storage layer 308. The capping layer 310 is configured to store oxygen, which can facilitate resistance changes within the dielectric data storage layer 308. In some embodiments, the capping layer 310 may comprise a metal or a metal oxide that is relatively low in oxygen concentration.

A buffer cap layer 314 is disposed over the top electrode 312. The buffer cap layer 314 has sidewalls that are aligned with sidewalls of the top electrode 312. The buffer cap layer 314 may comprise planar layer that is disposed between the top electrode 312 and an overlying masking layer 316 (e.g., a hard mask layer). In some embodiments, the masking layer 316 may comprise a silicon oxy-nitride (SiON) hard mask layer, a silicon dioxide ($SiO_2$) hard mask layer, or a PE-SiN hard mask. The masking layer 316 is configured to induce a stress 319 that pushes on the top electrode 312. The buffer cap layer 210 is configured to mitigate the stress 319, so as to reduce leakage current between the top electrode 312 and the bottom electrode 306.

In some embodiments, a top dielectric layer 318 may be disposed onto the masking layer 316. The top dielectric layer 318 may continuously extend along sidewalls of the capping layer 310, the top electrode 312, the buffer cap layer 314, and the masking layer 316. The top dielectric layer 318 separates the capping layer 310, the top electrode 312, the buffer cap layer 314, and the masking layer 316 from an upper inter-level dielectric (ILD) layer 320, which surrounds an upper metal interconnect layer 321 disposed onto the top electrode 312. The upper metal interconnect layer 321 comprises the upper metal via 322, which extends through the masking layer 316 and the buffer cap layer 314, from the top electrode 312 to an upper metal wire 324.

Figure 4:
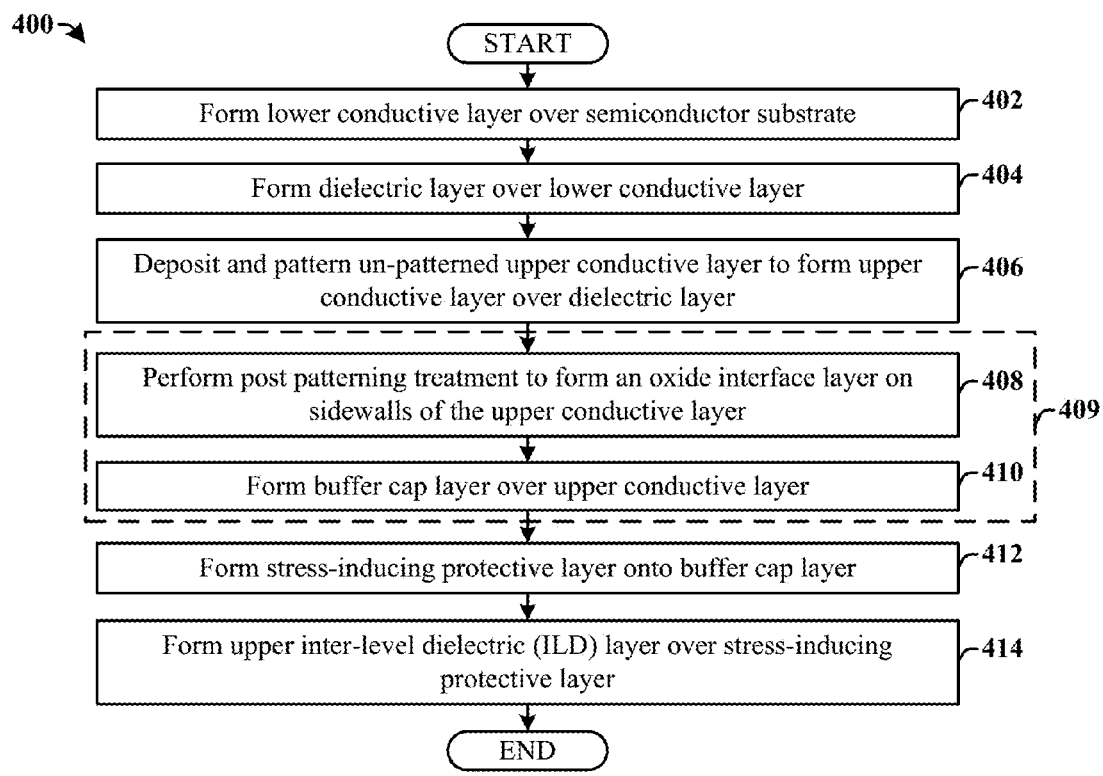
FIG. 4 illustrates a flow diagram of some embodiments of a method of forming an integrated chip comprising a MIM structure having a buffer cap layer.

FIG. 4 illustrates a flow diagram of some embodiments of a method 400 of forming an integrated chip comprising a MIM structure having a buffer cap layer.

At 402, a lower conductive layer is formed over a semiconductor substrate.

At 404, a dielectric layer is formed over the lower conductive layer. In various embodiments, the dielectric layer may comprise a high-k dielectric layer or a dielectric data storage layer having a variable resistance.

At 406, an un-patterned upper conductive layer is deposited and patterned to form an upper conductive layer over the dielectric layer.

At 408, a post patterning treatment is performed to form an oxide interface layer on sidewalls of the upper conductive layer. In some embodiments, the post patterning treatment comprises exposing sidewalls of the upper conductive layer to a nitrous oxide ($N_2O$) gas. The oxide interface layer prevents the presence of a metallic polymer residue on the sidewalls of the upper conductive layer, which can result from patterning (e.g., etching) of the upper conductive layer.

At 410, a buffer cap layer is formed over the upper conductive layer. In some embodiments, the buffer cap layer may be formed in-situ with the post patterning treatment (shown by box 409).

At 412, a stress-inducing protective layer (e.g., a PE-SiN layer or a PE-SiON layer) is formed onto the buffer cap layer. The stress-inducing protective layer is separated from the upper conductive layer by way of the buffer cap layer.

At 414, an upper inter-level dielectric (ILD) layer is formed over the stress-inducing protective layer.

Although method 400 describes the formation of the lower and upper conductive layers in a sequential manner, it will be appreciated that the method is not limited to such a sequential formation. For example, in some embodiments, the MIM structure may be formed by depositing a stack comprising a lower metal layer and an upper metal layer separated by a dielectric layer. The upper metal layer may subsequently be patterned prior to patterning of the lower metal layer.

Figure 5:
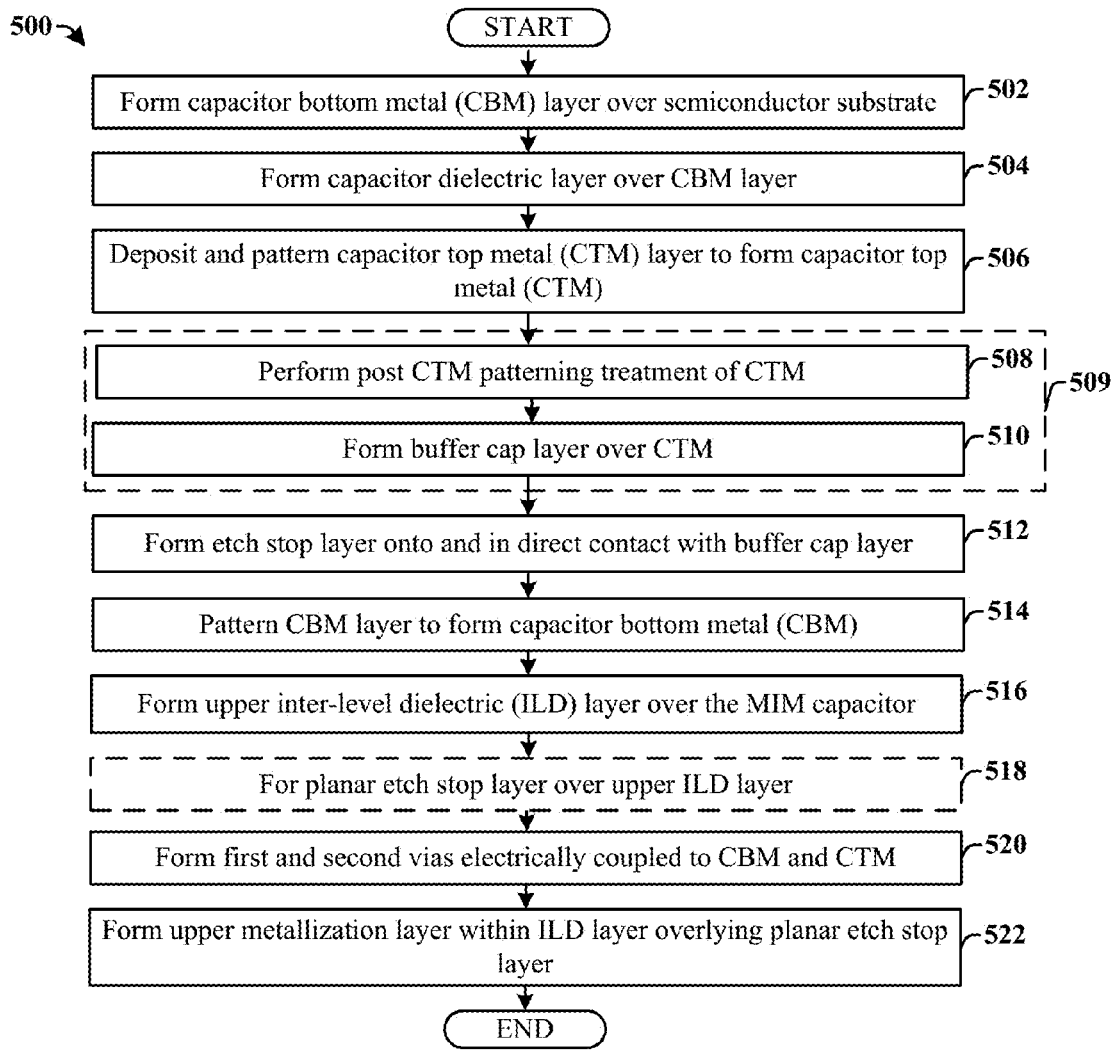
FIG. 5 illustrates a flow diagram of some embodiments of a method of forming an MIM structure comprising a MIM capacitor having a buffer cap layer.

FIG. 5 illustrates a flow diagram of some embodiments of a method 500 of forming an MIM structure comprising a MIM capacitor having a buffer cap layer.

While the disclosed methods (e.g., methods 400, 500, and 1500) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a capacitor bottom metal (CBM) layer is formed over a semiconductor substrate. In some embodiments, the CBM layer may be formed over a dielectric buffer layer overlying an under-metal layer having a metal inter-connect layer within a back-end-of-the-line (BEOL) stack of an integrated chip.

At 504, a capacitor dielectric layer is formed over the CBM layer. In some embodiments, the capacitor dielectric layer may comprise a high-k dielectric layer.

At 506, a capacitor top metal (CTM) layer is deposited over the capacitor dielectric layer and patterned to form a capacitor top metal (CTM) (i.e., a capacitor top electrode).

At 508, a post CTM patterning treatment is performed on the CTM. The post CTM patterning treatment forms a protective oxide interface layer onto sidewalls of the CTM. The protective oxide interface layer prevents the formation of conductive residue onto sidewalls of the CTM during etching (e.g., of the CTM)

At 510, a buffer cap layer is formed over the CTM. In some embodiments, the buffer cap layer may comprise an oxide layer (e.g., an un-doped silicate glass). In some embodiments, the buffer cap layer may be formed in-situ with the post CTM patterning treatment (shown by box 509).

At 512, an etch stop layer is formed onto and in direct contact with the buffer cap layer. In some embodiments, the etch stop layer may comprise a silicon nitride film formed by a PE-CVD deposition (a PE-SiN layer) process or a silicon oxy-nitride film formed by a PE-CVD deposition (a PE-SiON).

At 514, the CBM layer is patterned to form a CBM (i.e., a capacitor bottom electrode).

At 516, an upper inter-level dielectric (ILD) layer is formed over the MIM capacitor.

At 518, a planar etch stop layer may be formed over the upper ILD layer.

At 520, first and second vias are formed at positions vertically extending through the planar etch stop layer to the CBM and CTM.

At 522, an upper metallization layer is formed within a metal inter-level dielectric (ILD) layer overlying the planar etch stop layer. The upper metallization layer is electrically connected to the plurality of vias.

FIGS. 6-12 illustrate some embodiments of cross-sectional views showing a method of forming a MIM capacitor having a buffer cap layer. Although FIGS. 6-12 are described in relation to method 500, it will be appreciated that the structures disclosed in FIGS. 6-12 are not limited to such a method, but instead may stand alone as structures independent of the method.

Figure 6:
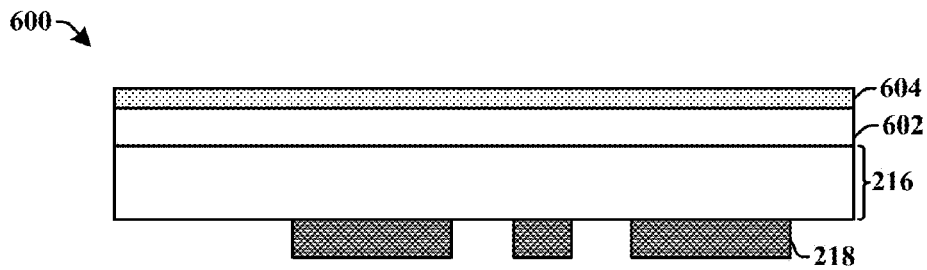
FIGS. 6-12 illustrate some embodiments of cross-sectional views showing a method of forming a MIM capacitor having a buffer cap layer.

FIG. 6 illustrates some embodiments of a cross-sectional view 600 corresponding to act 502-504.

As shown in cross-sectional view 600, a capacitor bottom metal (CBM) layer 602 is formed. The CBM layer 602 may be deposited by way of a physical vapor deposition (PVD) process. In some embodiments, the CBM layer 602 may comprise titanium nitride (TiN) or tantalum nitride (TaN). In some embodiments, the CBM layer 602 may be deposited over a dielectric buffer layer 216 that overlies an under-metal layer 218.

As further shown in cross-sectional view 600, a capacitor dielectric layer 604 is formed over the CBM layer 602. In some embodiments the capacitor dielectric layer 604 may be formed by an atomic layer deposition (ALD) process to a thickness in a range of between approximately 50 angstroms and approximately 100 angstroms.

Figure 7:
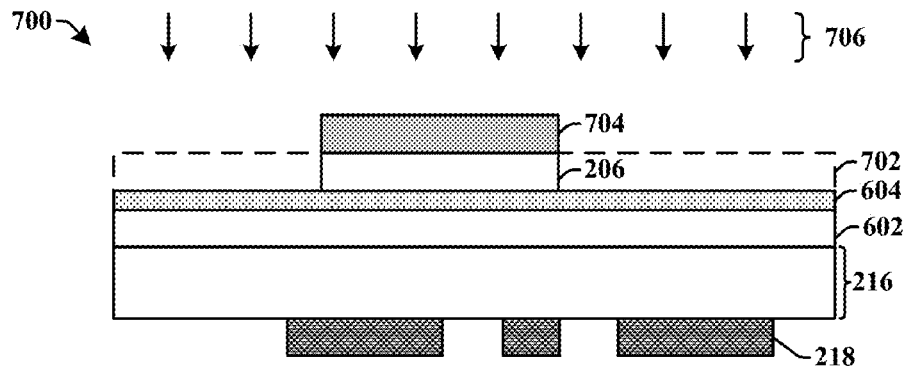

FIG. 7 illustrates some embodiments of a cross-sectional view 700 corresponding to act 506.

As shown in cross-sectional view 700, a capacitor top metal (CTM) layer 702 is formed over the capacitor dielectric layer 604. In some embodiments, the CTM layer 702 may comprise titanium nitride (TiN) or tantalum nitride (TaN), for example. In some embodiments, the CTM layer 702 may be formed by way of a vapor deposition process (e.g., physical vapor deposition, chemical vapor deposition, etc.). A masking layer 704 is selectively formed over a part of the CTM layer 702 to define a capacitor top metal (CTM) 206 (i.e., a top electrode of the MIM capacitor). In some embodiments, the masking layer 704 may comprise a hard mask material. For example, the masking layer 704 may comprise silicon nitride (SiN) or silicon oxy-nitride (SiON).

A top electrode etching process is subsequently performed by selectively exposing the capacitor top metal layer 702 to an etchant 706 in areas not covered by the masking layer 704. The etchant 706 forms the CTM 206 by removing unmasked areas of the CTM layer 702. In some embodiments, the etchant 706 may comprise a dry etchant (e.g., a plasma etchant, an RIE etchant, etc.).

Figure 8:
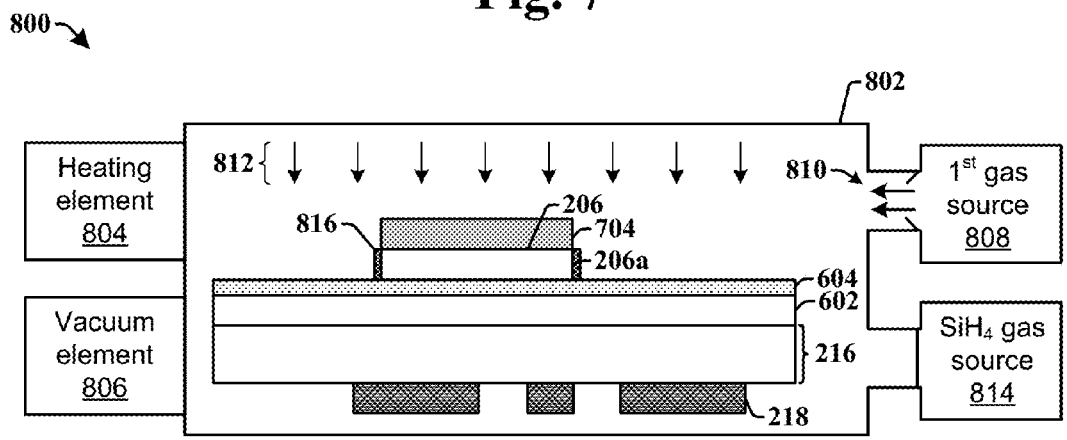

FIG. 8 illustrates some embodiments of a cross-sectional view 800 corresponding to act 508.

As shown in cross-sectional view 800, a post capacitor top metal (CTM) patterning treatment is performed on the CTM 206. The post CTM patterning treatment exposes the sidewalls 206a of the CTM 206 to one or more post CTM treatment agents 812 comprising an oxygen containing gas(es). In some embodiments, the one or more post CTM treatment agents 812 may comprise nitrous-oxide ($N_2O$).

It has been appreciated that after etching the CTM layer 702, a metallic polymer residue remains on the sidewalls 206a of the CTM 206. The metallic polymer residue causes worse leakage currents in a resulting MIM capacitor. The one or more post CTM treatment agents 812 are configured to form an oxide interface layer 816 onto the sidewalls 206a of the CTM 206, which protect the CTM 206 from the metallic polymer residue. In some embodiments, the oxide interface layer 816 may comprise titanium oxide ($TiO_x$), titanium oxy-nitride (TiON), tantalum oxide ($TaO_x$), or tantalum oxy-nitride (TaON).

In some embodiments, the post CTM patterning treatment may be performed by providing a semiconductor substrate into a processing chamber 802 coupled to a heating element 804 and a vacuum element 806. The heating element 804 is configured to increase a temperature of the processing chamber 802. For example, in some embodiments the heating element 804 may increase a temperature of the processing chamber 802 to a temperature in a range of between approximately 200° C. and approximately 600° C. The vacuum element 806 is configured to generate a low pressure ambient within the processing chamber 802. For example, in some embodiments the vacuum element 806 may decrease a pressure of the processing chamber 802 to a pressure in a range of between approximately 1 torr and approximately 5 torr.

The processing chamber 802 is connected to a first gas source 808 configured to provide one or more oxygen-containing first gases 810 into the processing chamber 802 and a second gas source 814 configured to selectively provide one or more second gases into the processing chamber 802. In some embodiments, the first gas source 808 may be configured to provide one or more oxygen-containing first gases 810 comprising nitrous oxide gas ($N_2O$) into the processing chamber 802. The nitrous oxide gas ($N_2O$) acts as a post CTM treatment agent 812 configured to contact the sidewalls 206a of the CTM 206 to form the oxide interface layer 816. In other embodiments, the first gas source 808 may be configured to provide alternative oxygen-containing first gases such as ozone ($O_3$), water vapor ($H_2O$), hydrogen peroxide gas ($H_2O_2$), nitrogen oxide (NO), carbon dioxide ($CO_2$), etc.

Figure 9:
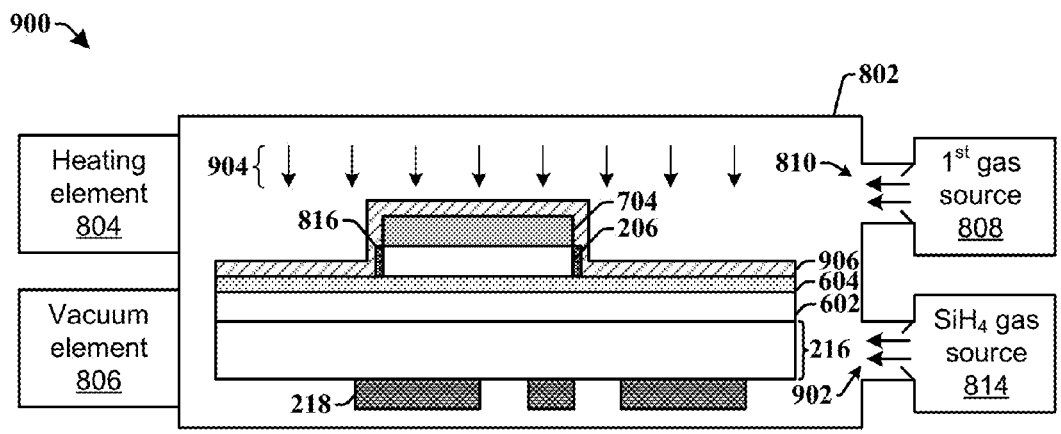

FIG. 9 illustrates some embodiments of a cross-sectional view 900 corresponding to act 510.

As shown in cross-sectional view 900, an un-patterned buffer cap layer 906 is formed onto the masking layer 704. In some embodiments, the un-patterned buffer cap layer 906 may be formed in-situ (act 509) with the post CTM patterning treatment. For example, after conclusion of the post CTM patterning treatment the second gas source 814 may be configured to introduce one or more additional gases 902 into the processing chamber 802. For example, in some embodiments during the post CTM patterning treatment the first gas source 808 may introduce nitrous oxide gas ($N_2O$) into the processing chamber 802, while during the formation of the un-patterned buffer cap layer 906 the second gas source 814 may additionally introduce silane gas ($SiH_4$) into the processing chamber 802. The nitrous oxide gas ($N_2O$) and the silane gas ($SiH_4$) collective act to form the un-patterned buffer cap layer 906 by way of a chemical vapor deposition (CVD) process. In some embodiments, the un-patterned buffer cap layer 906 may comprise an oxide (e.g., an un-doped silicate glass), for example.

Figure 10:
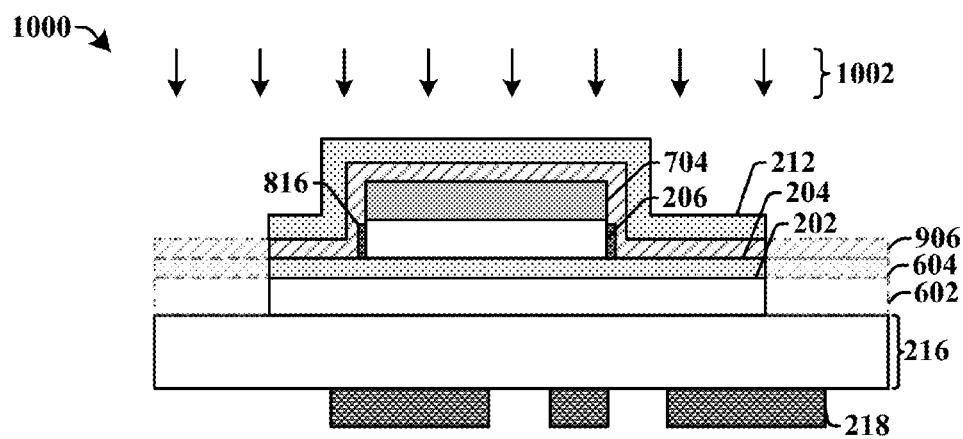

FIG. 10 illustrates some embodiments of a cross-sectional view 1000 corresponding to acts 512-514.

As shown in cross-sectional view 1000, an etch stop layer 212 is deposited onto the un-patterned buffer cap layer 906. In some embodiments, the etch stop layer 212 may comprise a silicon nitride film formed by a PE-CVD deposition (a PE-SiN layer) process or a silicon oxy-nitride film formed by a PE-CVD deposition (a PE-SiON layer), for example. In some embodiments, the etch stop layer 212 may be deposited by way of a vapor deposition process (e.g., physical vapor deposition, chemical vapor deposition, etc.).

A bottom electrode etching process is subsequently performed by selectively exposing the un-patterned buffer cap layer 906, the capacitor dielectric layer 604, and the CBM layer 602 to an etchant 1002. The etchant 1002 defines a capacitor bottom metal (CBM) 202 (i.e., a bottom electrode of the MIM capacitor) by removing portions of the CBM layer 602. In some embodiments, the etchant 1002 may comprise a dry etchant (e.g., a plasma etchant, an RIE etchant, etc.).

Figure 11:
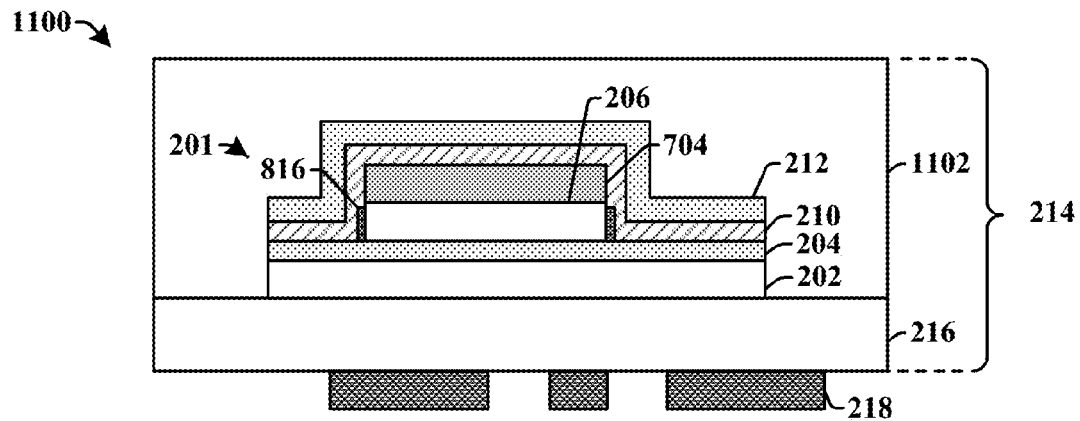

FIG. 11 illustrates some embodiments of a cross-sectional view 1100 corresponding to act 516.

As shown in cross-sectional view 1100, an upper capacitor inter-level dielectric (ILD) layer 1102 is formed onto the MIM capacitor 201. In various embodiments, the upper capacitor ILD layer 1102 may comprise a low-k dielectric material, an oxide material, etc. The upper capacitor ILD layer 1102 may be deposited by way of a vapor deposition technique (e.g., PVD, CVD, etc.).

Figure 12:
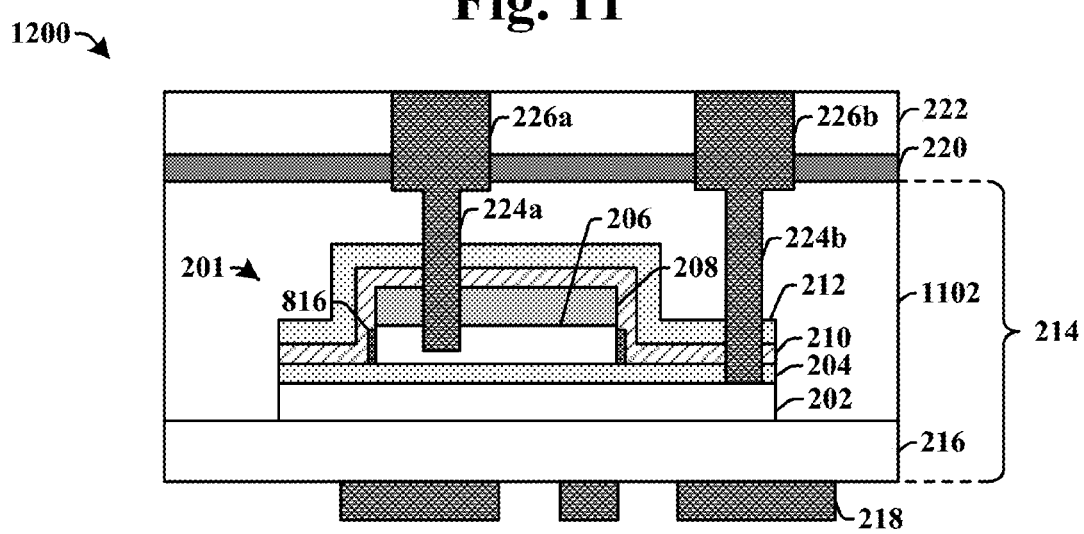

FIG. 12 illustrates some embodiments of a cross-sectional view 1200 corresponding to acts 518-522.

As shown in cross-sectional view 1200, a planarization process may be performed to form a planar surface on top of the upper capacitor ILD layer 1102. A planar etch stop layer 220 is then formed over the upper capacitor ILD layer 1102. A first metal via 224a and a second metal via 224b are then formed to electrically connect metal wires, 226a and 226b, to the CTM 206 and the CBM 202, respectively. The first and second metal vias, 224a and 224b, may be formed by depositing a metal ILD layer 222 over the planar etch stop layer

220. A via etching process (e.g., a dry etching process) is performed to form openings that extend from a top of the metal ILD layer 222 to the CTM 206 and the CBM 202. A metal (e.g., copper, tungsten, aluminum, etc.) is then deposited within the openings to form the first and second vias, 224a and 224b.

Figure 13:
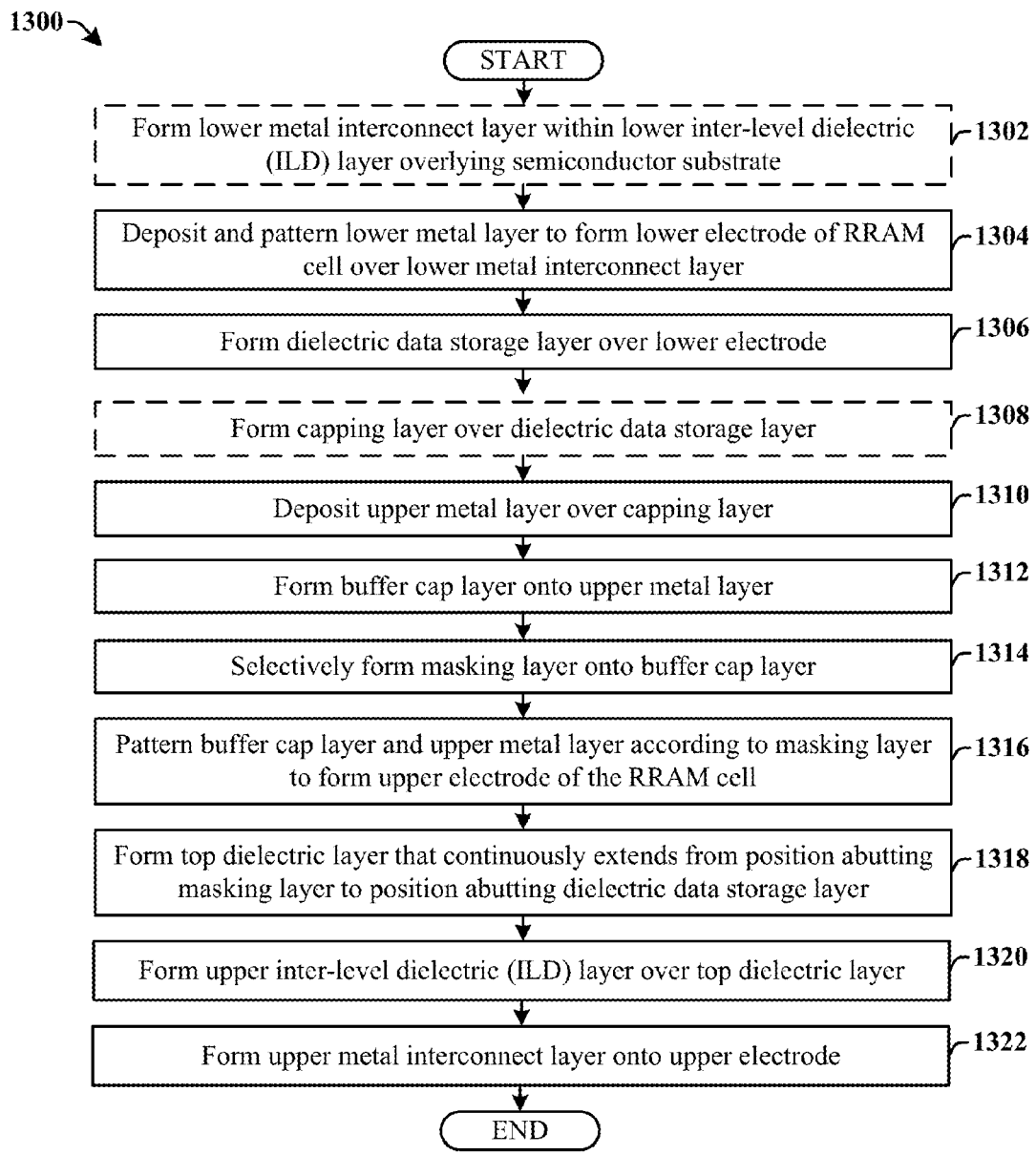
FIG. 13 illustrates a flow diagram of some embodiments of a method of forming an MIM structure comprising a RRAM cell having a buffer cap layer.

FIG. 13 illustrates a flow diagram of some embodiments of a method 1300 of forming an MIM structure comprising a resistive random access memory (RRAM) cell having a buffer cap layer.

At 1302, a lower metal interconnect layer is formed within a lower inter-level dielectric (ILD) layer overlying a semiconductor substrate. In some embodiments, the lower metal interconnect layer may comprise a copper metal layer formed using a damascene process.

At 1304, a lower metal layer is deposited and patterned to form a lower electrode of the RRAM cell over the lower metal interconnect layer. The lower electrode may comprise tantalum (Ta), tantalum nitride (TaN), titanium (Ti), titanium nitride (TiN), deposited by way of a physical vapor deposition technique (e.g., CVD, PVD, etc.).

At 1306, a dielectric data storage layer having a variable resistance is formed over the lower electrode. In some embodiments, the dielectric data storage layer may comprise a hanfnium oxide layer (HfO) deposited by way of a physical vapor deposition technique.

At 1308, a capping layer may be formed over the dielectric data storage layer. The capping layer is configured to store oxygen. In some embodiments, the capping layer may comprise a metal such as titanium (Ti), hafnium (Hf), platinum (Pt), ruthenium (Ru), and/or aluminum (Al). In other embodiments, the capping layer may comprise a metal oxide such as titanium oxide ($TiO_x$), hafnium oxide ($HfO_x$), zirconium oxide ($ZrO_x$), germanium oxide ($GeO_x$), cesium oxide ($CeO_x$).

At 1310, an upper metal layer is deposited over the capping layer. The upper conductive layer may comprise tantalum (Ta), tantalum nitride (TaN), titanium (Ti), titanium nitride (TiN), deposited by way of a physical vapor deposition technique (e.g., CVD, PVD, etc.).

At 1312, a buffer cap layer is formed over the upper metal layer. In some embodiments, the buffer cap layer may comprise an oxide layer (e.g., an un-doped silicate glass).

At 1314, a masking layer is formed onto the buffer cap layer. The masking layer defines an upper electrode of the RRAM cell. In some embodiments, the masking layer may comprise a silicon oxy-nitride (SiON) hard mask layer, a silicon dioxide ($SiO_2$) hard mask layer, or a PE-SiN hard mask At 1316, the buffer cap layer and the upper metal layer are patterned according to the masking layer. Patterning of the upper conductive layer results in the formation of an upper electrode of the RRAM cell.

At 1318, a top dielectric layer is formed over the masking layer. In some embodiments, the top dielectric layer continuously extends from position abutting the masking layer to position abutting the dielectric data storage layer. In various embodiments, the top dielectric layer may comprise silicon nitride (SiN) or silicon carbide (SiC), for example.

At 1320, an upper inter-level dielectric (ILD) layer is formed over the top dielectric layer. In various embodiments, the upper capacitor ILD layer may comprise a low-k dielectric material, an oxide material, etc At 1322, an upper metal interconnect layer is formed onto the upper electrode. The upper metal interconnect layer comprises an upper metal via formed at a position in contact with the upper electrode, and an upper metal wire formed in contact with the upper metal via.

Therefore, the present disclosure relates to a method of forming a MIM (metal-insulator-metal) structure having a buffer cap layer that is configured to reduce stress induced by an overlying stress-inducing protective layer, and an associated apparatus.

In some embodiments, the present disclosure relates to a method of forming a MIM (metal-insulator-metal) structure. The method comprises forming a lower conductive layer over a semiconductor substrate, forming a dielectric layer over the lower conductive layer, and forming an upper conductive layer over the dielectric layer. The method further comprises forming a buffer cap layer over the upper conductive layer. The method further comprises forming a stress-inducing protective layer onto the buffer cap layer, wherein the buffer cap layer is configured to reduce a stress induced onto the upper conductive layer by the stress-inducing protective layer.

In other embodiments, the present disclosure relates to a method of forming a MIM (metal-insulator-metal) structure. The method comprises forming a lower conductive layer over a semiconductor substrate. The method further comprises depositing an un-patterned upper conductive layer at a position separated from the lower conductive layer by a dielectric layer, and patterning the un-patterned upper conductive layer according to a masking layer to form an upper conductive layer. The method further comprises performing a post patterning treatment to form an oxide interface layer on sidewalls of the upper conductive layer. The method further comprises forming a buffer cap layer comprising an un-doped silicate glass (USG) in-situ with the post patterning treatment. The method further comprises forming a stress-inducing protective layer onto the buffer cap layer, wherein the buffer cap layer is configured to reduce a stress induced onto the upper conductive layer by the stress-inducing protective layer.

In yet other embodiments, the present disclosure relates to a MIM (metal-insulator-metal) structure. The MIM structure comprises a bottom conductive layer disposed over a semiconductor substrate, a dielectric layer disposed over the bottom conductive layer, and an upper conductive layer over the dielectric layer. The MIM structure further comprises a buffer cap layer over the upper conductive layer. The MIM structure further comprises a stress-inducing protective layer onto the buffer cap layer, wherein the buffer cap layer is configured to reduce a stress induced onto the upper conductive layer by the stress-inducing protective layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a MIM (metal-insulator-metal) structure, comprising:
   forming a lower conductive layer over a semiconductor substrate;
   forming a dielectric layer over the lower conductive layer;
   forming an upper conductive layer over the dielectric layer;

forming a buffer cap layer over the upper conductive layer; and forming a stress-inducing protective layer vertically arranged between the buffer cap layer and a dielectric material laterally surrounding a metal via layer that vertically extends through the stress-inducing protective layer, wherein the buffer cap layer is configured to reduce a compressive stress induced onto the upper conductive layer by the stress-inducing protective layer.

2. The method of claim 1, further comprising:
forming an oxide interface layer onto sidewalls of the upper conductive layer, wherein the oxide interface layer prevents a presence of a metallic polymer residue on the sidewalls of the upper conductive layer, which results from patterning of the upper conductive layer.

3. The method of claim 2, wherein forming the oxide interface layer, comprises:
introducing one or more oxygen-containing first gases into a processing chamber, wherein the one or more oxygen-containing first gases form the oxide interface layer onto the sidewalls of the upper conductive layer.

4. The method of claim 3, wherein forming the buffer cap layer, comprises:
introducing one or more second gases into the processing chamber in-situ with introducing the one or more oxygen-containing first gases, wherein the one or more oxygen-containing first gases and the one or more second gases collectively act to form the buffer cap layer by way of a chemical vapor deposition (CVD) process.

5. The method of claim 1, wherein the stress-inducing protective layer includes a PE-SiN or PE-SiON layer comprising a silicon nitride or a silicon oxy-nitride film formed by a plasma enhanced chemical vapor deposition (PE-CVD) process.

6. The method of claim 1, wherein the buffer cap layer comprises an un-doped silicate glass.

7. The method of claim 1, wherein forming the dielectric material comprises:
depositing an upper inter-level dielectric (ILD) layer over the stress-inducing protective layer;
performing a planarization process on the upper ILD layer to form a planar surface; and
forming a planar etch stop layer onto the planar surface.

8. The method of claim 1,
wherein the dielectric layer comprises a dielectric data storage layer having a variable resistance; and
wherein the buffer cap layer comprises a planar layer having sidewalls aligned with sidewalls of the upper conductive layer.

9. The method of claim 1, wherein the stress-inducing protective layer has a sidewall that is laterally aligned with a sidewall of the dielectric layer.

10. The method of claim 1, wherein the metal via layer vertically extends through the stress-inducing protective layer from the upper conductive layer to an overlying metal wire layer surrounded by a metal ILD layer over the dielectric material.

11. The method of claim 1, wherein the upper conductive layer laterally contacts the buffer cap layer.

12. The method of claim 1, wherein the lower conductive layer laterally contacts the dielectric material.

13. A method of forming a MIM (metal-insulator-metal) structure, comprising:
forming a lower conductive layer over a semiconductor substrate;

depositing an un-patterned upper conductive layer at a position separated from the lower conductive layer by a dielectric layer;

patterning the un-patterned upper conductive layer according to a masking layer to form an upper conductive layer;

performing a post patterning treatment to form an oxide interface layer on sidewalls of the upper conductive layer;

forming a buffer cap layer comprising an un-doped silicate glass (USG) in-situ with the post patterning treatment; and forming a stress-inducing protective layer onto the buffer cap layer, wherein the stress-inducing protective layer has a sidewall that is laterally aligned with a sidewall of the dielectric layer, and wherein the buffer cap layer is configured to reduce a compressive stress induced laterally onto the upper conductive layer by the stress-inducing protective layer.

14. The method of claim 13, wherein performing the post patterning treatment, comprises:
introducing one or more oxygen-containing first gases into a processing chamber, wherein the one or more oxygen-containing first gases form the oxide interface layer onto the sidewalls of the upper conductive layer.

15. The method of claim 14, wherein forming the buffer cap layer, comprises:
introducing one or more second gases into the processing chamber in-situ with introducing the one or more oxygen-containing first gases, wherein the one or more oxygen-containing first gases and the one or more second gases collectively act to form the buffer cap layer by way of a chemical vapor deposition (CVD) process.

16. The method of claim 13, wherein the stress-inducing protective layer includes a PE-SiN or PE-SION layer comprising a silicon nitride or a silicon oxy-nitride film formed by a plasma enhanced chemical vapor deposition (PE-CVD) process.

17. The method of claim 13,
wherein the dielectric layer comprises a high-k dielectric layer having a dielectric constant that is greater than 3.9; and
wherein the buffer cap layer comprises a stepped layer that abuts sidewalls of the upper conductive layer.

18. A MIM (metal-insulator-metal) structure, comprising:
a bottom conductive layer disposed over a semiconductor substrate;
a dielectric layer disposed over the bottom conductive layer;
an upper conductive layer disposed over the dielectric layer;
a buffer cap layer disposed over the upper conductive layer; and
a stress-inducing protective layer vertically arranged between the buffer cap layer and a dielectric material laterally surrounding a metal via layer that vertically extends through the stress-inducing protective layer, wherein the buffer cap layer is configured to reduce a compressive stress laterally induced onto the upper conductive layer by the stress-inducing protective layer.

19. The MIM structure of claim 18, wherein the stress-inducing protective layer includes a PE-SiN layer comprising a silicon nitride film formed by a plasma enhanced chemical vapor deposition (PE-CVD) process.

20. The MIM structure of claim 18, wherein the buffer cap layer comprises an un-doped silicate glass.

* * * * *